United States Patent [19]

Vaughn

[11] Patent Number: 4,870,665
[45] Date of Patent: Sep. 26, 1989

[54] DIGITAL PULSE GENERATOR HAVING A PROGRAMMABLE PULSE WIDTH AND A PULSE REPETITION INTERVAL

[75] Inventor: Charles J. Vaughn, Fremont, Calif.

[73] Assignee: GTE Government Systems Corporation, Stamford, Conn.

[21] Appl. No.: 228,159

[22] Filed: Aug. 4, 1988

[51] Int. Cl.$^4$ .................... H03K 5/04; H03K 5/135
[52] U.S. Cl. ................................. 328/61; 328/58; 307/265; 307/271; 377/39; 377/56
[58] Field of Search ............... 307/265, 271; 377/20, 377/39, 56; 328/58, 61

[56] References Cited

U.S. PATENT DOCUMENTS

| | | | |
|---|---|---|---|
| 3,870,962 | 3/1975 | D'Errico | 307/271 |
| 4,049,953 | 9/1977 | Evans | 307/271 |
| 4,079,234 | 3/1978 | Kashio | 377/39 |
| 4,255,793 | 3/1981 | Nakamura | 307/271 |
| 4,330,751 | 5/1982 | Swain | 377/56 |
| 4,339,657 | 7/1982 | Larson et al. | 377/39 |
| 4,415,861 | 11/1983 | Palmquist et al. | 328/58 |
| 4,608,706 | 8/1986 | Chang et al. | 377/39 |
| 4,623,846 | 11/1986 | Lamacchia | 328/61 |
| 4,754,163 | 6/1988 | Aue et al. | 307/265 |

Primary Examiner—John S. Heyman
Attorney, Agent, or Firm—Douglas M. Gilbert

[57] ABSTRACT

A technique for accurately controlling both the pulse repetition interval and pulse width of a pulse signal generator which uses a crystal oscillator to maintain a very accurate time base. Two separate digital counters clock-in the clock pulses. When the desired number of clock pulses are registered by the first counter, a first digital comparator generates a start pulse which resets the first counter and triggers an output flip-flop. The change of state in the flip-flop enables the second counter to begin its count. When the desired number of clock pulses are registered by the second counter, a second digital comparator generates an end pulse which resets the second counter and triggers the flip-flop a second time. The second change of state of the flip-flop disables the second counter until the first comparator generates a new start pulse. The new start pulse toggles the flip-flop and the entire process is repeated continuously to generate at the output of the flip-flop a periodic pulse train having the desired pulse width with the leading edges separated by the desired pulse repetition interval.

18 Claims, 5 Drawing Sheets

DIGITAL PULSE GENERATOR HAVING A PROGRAMMABLE PULSE WIDTH AND A PULSE REPETITION INTERVAL

BACKGROUND OF THE INVENTION

1. Field of the Invention

The present invention relates generally to pulse generators and more particularly to a technique for accurately controlling the pulse repetition interval and pulse width of a pulse generator.

2. Description of the Prior Art

In the electronics industry of today, pulse signal generators are indispensible test instruments used in many manufacturing and engineering applications. They are commercially available from many different sources although not always under the same generic name. Sometimes they are referred to as digital waveform generators, digital synthesizers, or pulse generators. Although commercial generators vary somewhat in the features offered, most models have the capability of producing pulse waveforms of variable pulse width (PW) and variable pulse repetition interval (PRI), and most have an accuracy to ± a few percent. Many can accurately control the pulse width or the pulse repetition interval, but not both with high precision and stability. Unfortunately a high degree of precision and stability is often required by specific applications. A few commercial pulse generators have crystal controlled time bases to regulate the accuracy of the PRI but not the pulse width.

The subject invention overcomes these drawbacks by employing a stabilization technique for locking both the PRI and pulse width of a digital signal to a highly stable clock signal, such as a crystal controlled oscillator.

An object of this invention is the provision of a pulse waveform generator capable of producing a pulse waveform having an adjustable PRI and pulse width both locked to a ultra stable clock signal.

Still another object of this invention is the provision of a pulse waveform generator capable of producing a pulse waveform having a pulse repetition interval and a pulse width which can be independently programmed at any time by two separate control signals to an accuracy determined by the time base of the reference clock oscillator.

BRIEF SUMMARY OF THE INVENTION

The above and other objects, advantages and capabilities are achieved in one aspect of the invention by a pulse generator which generates a periodic pulse train output having an adjustable pulse repetition interval (rep rate) and an adjustable pulse width, both of which are precisely controlled in time by a reference clock signal. A reference clock signal, which establishes the time base for the pulse generator, drives two separate counters which operate in a similar manner to register the clock pulses. When the desired number of clock pulses are registered by the first counter, a first digital comparator generates a start pulse which resets the first counter and triggers an output bistable circuit. The change of state in the bistable circuit enables the second counter to begin its count. When the desired number of clock pulses are registered by the second counter, a second digital comparator generates an end pulse which resets the second counter and triggers the bistable circuit a second time. The second change of state of the bistable circuit disables the second counter until the first comparator generates a new start pulse. The new start pulse toggles the bistable circuit and the entire process is repeated continuously to generate a periodic pulse train having the desired pulse width with the leading edges separated by the desired pulse repetition interval. The predetermined maximum count of the first counter/comparator determines the PRI of the desired output signal, and the predetermined maximum count of the second counter/comparator determines the pulse width of the desired output signal. In the preferred embodiment of this invention the predetermined maximum counts of the first and second counter/comparator are programmed by a first and second external control signal.

BRIEF DESCRIPTION OF THE DRAWINGS

For a better understanding of the invention as well as other objects and further features thereof, reference is made to the following description which is to be read in conjunction with the accompanying drawings wherein.

DETAILED DESCRIPTION OF THE INVENTION

Figure 1:
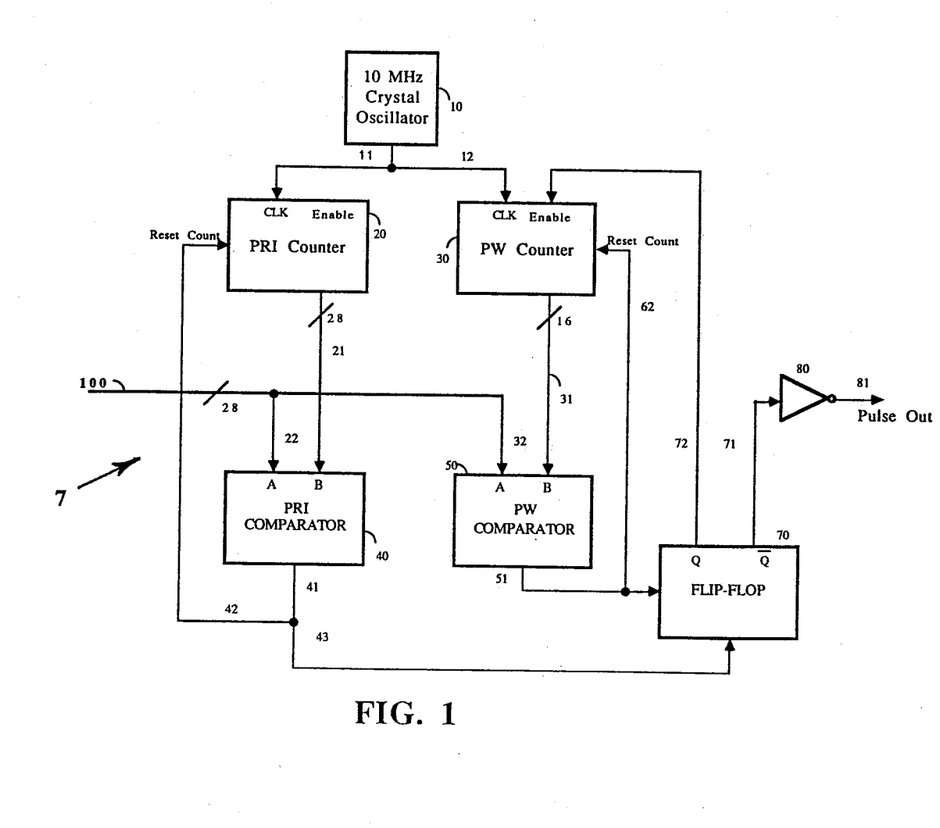
FIG. 1 is a schematic block diagram of a pulse generator with a crystal time base.

For a better understanding of the subject invention, reference is made to the following description and appended claims in conjunction with the above-described drawings. FIG. 1 illustrates in block diagram form a pulse generator 7 in accordance with one aspect of the subject invention. To establish a very stable clock signal $f_1(t)$, a crystal controlled clock oscillator 10 is employed, however, any stable clock frequency source could be used, either local or external providing there is compatibility with the other circuitry with which it must interface. For purposes of this explanation, oscillator 10 is set to a output rep rate $f_c$ of 10 Mb/s which means the generator must operate on a time base of 100 ns. The choice of what rep rate or frequency is best depends upon a number of factors, such as minimum pulse width desired, the type of counters used, etc. all of which are well known by those skilled in the art. The 110 Mb/s clock signal $f_1(t)$ on paths 11 and 12 feeds the CLK inputs of PRI counter 20 and PH counter 30. Both counters are virtually identical. Each counts the clock pulses present at its CLK input and produces a periodic output signal [$f_2(t)$ on path 21 and $f_3(t)$ on path 31]. These two signals are BCD (binary coded decimal) and correspond to the current count of clock pulses. PRI counter 20 has a 2B lead parallel output collectively identified as path 21, and PW counter 30 has a 16 lead parallel output collectively identified as path 31. Path 31 has fewer output leads than path 21 because the maximum BCD number on path 31 is always smaller than the maximum number on path 21. Both counters have reset inputs for clearing the internal registers and for restarting the count cycle. In addition both have an enable input even though PRI counter 20 does not use the enable function in this configuration. In this embodiment only the PW counter 30 uses the enabling/disabling function which permits the counter to operate when a logic "1" is present and disables the counter when a logic "0" (ground) is present.

As shown in FIG. 1 PRI counter 20 and PW counter 30 connect to two identical comparator circuits 40 and 50, respectively. Output path 21 connects to the "B" input of comparator circuit 40, and output path 31 connects to the "B" input of comparator circuit 50. The "A" inputs of both comparators, shown connected to data bus 100 via paths 22 and 32, set the cycle times of both the PRI and PW counter/comparators. Each counter starts at zero and increments until the number of clock pulses counted equals the corresponding number of desired clock pulses set by an appropriate data signal on data bus 100 as shown in FIG. 1. The number of desired clock pulses $N_1$ and $N_2$ can be preset into comparators 40 and 50, respectively, or can be advantageously programmed into the comparators from an external source via data bus 100. When each counter reaches the desired count, the associated comparator generates a resetting pulse, via either path 42 or 62, to reset the associated counter to zero. Delay line 60 is a time delay circuit, the purpose of which is to delay the pulse from comparator 50. For purposes of this initial discussion, it may be thought of as a straight connection from path 51 to path 61 (i.e. bypassed).

The output of comparator 40 is also applied via path 43 to one input of bistable circuit 70 which is preferably a J-K flip-flop. Similarly the output of comparator 50 is applied (through the delay line 60) to a second input of flip-flop 70. Flip-flop 70 changes state when a pulse (a "1") is applied on either input. The Q output connects via path 72 to the enable input of PW counter 30 while the $\overline{Q}$ output connects to an inverter and line driver circuit 80. When the Q output goes high, (a "1"), it enables counter 30 to begin its count cycle.

Figure 2:
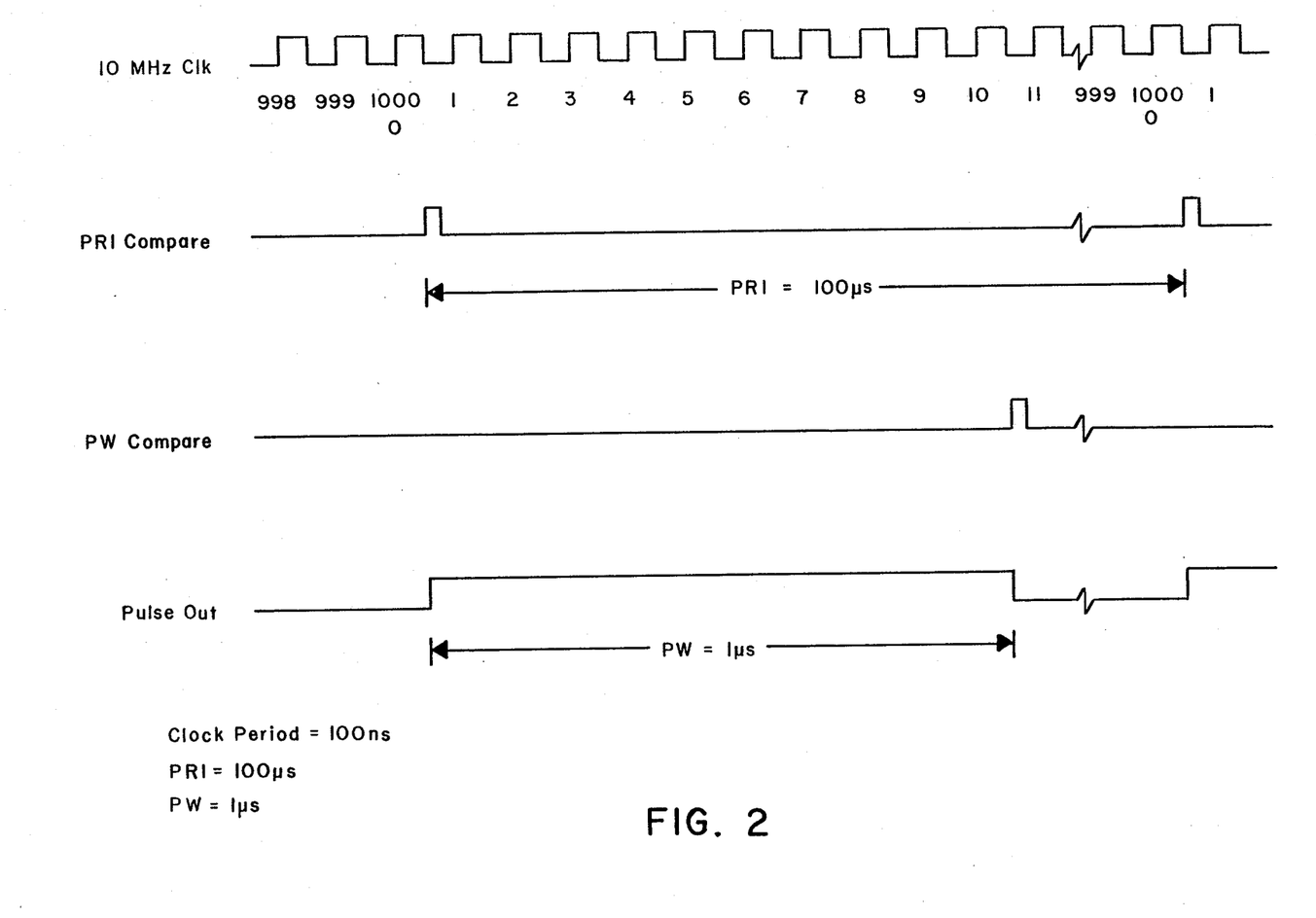
FIG. 2 is a timing diagram illustrating the operation of the pulse generator depicted in FIG. 1.

It is easiest to understand the functional operation of generator 7 by referring to the timing diagram of FIG. 2 read in conjunction with the block diagram of FIG. 1. In FIG. 2 the uppermost waveform, "Clk," represents the 10 Mb/s clock signal on path 11 having a 100 ns clock period. The "PRI Compare" waveform represents the output of comparator 40 on path 41, and the "PW Compare" waveform represents the output of comparator 50 on path 51. The bottom waveform, "Pulse Out," represents both the desired output signal on path 81 and the Q output on path 72. Referring to FIG. 1 again, the PRI counter 20, unlike the PW counter 30, is not periodically disabled implying that the PRI counter 20 is free running and continually counts from zero to some programmed count until it is reset. Every programmed interval comparator 40 produces a single pulse referred to as a reset pulse or a start pulse since it starts the leading edge of the output pulse signal on path 81. This start pulse occurs at the same rate as the desired pulse repetition interval because the BCD number $N_1$ set into the "A" input of comparator 40 equals the number of clock pulses that are counted during the desired pulse repetition interval. In the example given for a desired PRI of 100 μs, the "A" input should be programmed for 1000 (in BCD). A start pulse on path 43 toggles flip-flop 70 causing the Q output to go high. This enables PW counter 30 to start its count along with the free running PRI Counter 20. The PW counter 30/comparator 50 combination is set in a manner analogous to the PRI Counter 20/comparator 40, except that the number of clock pulses (10 in the example chosen) must equal the desired pulse width not the pulse repetition interval. When PW counter 30 reaches its predetermined count, ($N_2=10$) PW comparator 50 generates an "end pulse" signal on path 61 (shown as the single "PW Compare" pulse in FIG. 2) to reset the PW counter 30 via path 62 and also to toggle flip-flop 70. This causes a high to low transition on path 81 at (Pulse Out in FIG. 2) and also on path 72 which immediately disables the PH Counter 30. PW Counter 30 remains disabled (idle) and the "Pulse Out" signal remains low ("0") until a subsequent start pulse is generated by PRI Comparator 40. This toggles flip-flop 70, Q goes high restarting PW Counter 30, and the entire process begins all over again to generate a pulse train having the programmed PW with their leading edges separated by the programmed PRI.

Those skilled in the art may have noted that a possible race condition may exist in the pulse width circuitry immediately after each PW Counter/Comparator count, since the reset pulse on path 62 may reset counter 30 prior to the Q output signal disabling the PW counter. A worst case timing analysis shows that in most cases the reset pulse will hold counter 30 long enough to cover the variance in propagation delays through the J-K flip-flop 70. In the case where the reset pulse on 62 is delayed by more than 50 ns, ½ of a clock cycle, and counter 30 does register a clock interval, the reset pulse on path 62 eventually resets counter 30 and holds it reset until the disabling high-to-low transition on path 72 reaches the counter so that the extra count will have no effect.

The main signal output port, designated as "Pulse Out" in FIG. 1, is the output from the inverter and line driver 80 rather than the Q output of flip-flop 70. Although the signal at the Q output of flip-flop 70 on path 72 and the output signal on path Bl are basically the same signal, the output power from either output port Q or $\overline{Q}$ is insufficient to drive multiple circuits. Therefore, for practical reasons the main output is taken off of the $\overline{Q}$ output with a line driver and inverter 81 inserted to increase the signal level and invert the polarity of the signal.

The Delay Line 60 is a tapped delay line capable of adding from 0 to 90 ns of linear delay in steps of 10 ns to the pulse signal on path 51. By delaying the end pulse signal in steps of 10 ns, the pulse width of the output pulse on path 81 can be incremented in steps of 10 ns even though a single clock period is ten times longer (100 ns). This feature of the invention adds a fine adjustment control of the pulse width without changing any aspect of the basic clock signal. The amount of delay may be either manually inserted using a fixed delay line providing a discrete amount of time delay, or preferably may be externally controlled and periodically varied by the digital control signal on path 33.

Figure 3:
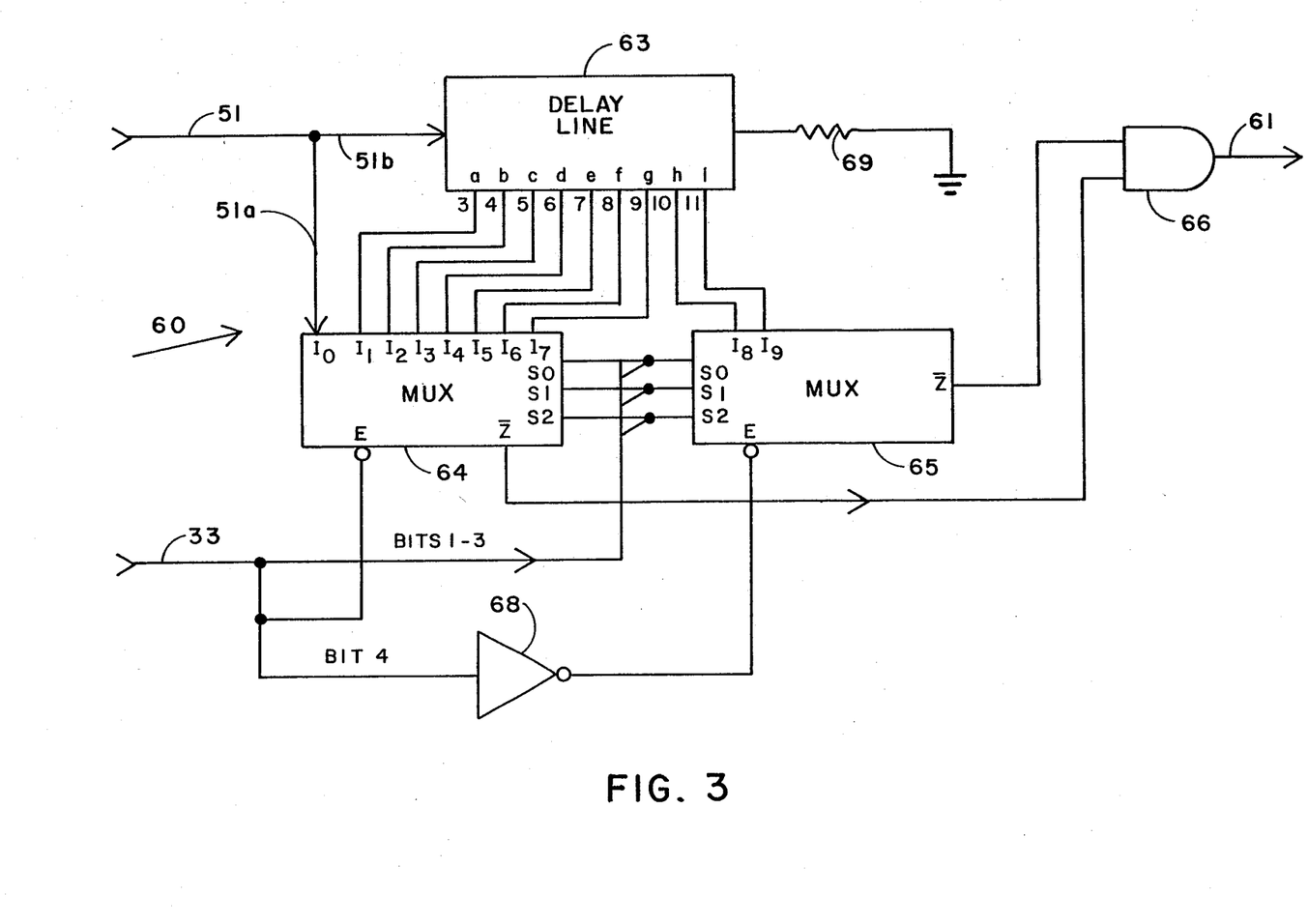
FIG. 3 is a schematic block diagram of a programmable variable time delay circuit.

Referring to FIG. 3, one embodiment of delay line 60 is shown in greater detail where like numbers in FIG. 1 and 3 refer to corresponding parts. The end pulse from PW comparator 50 enters on path 51 and goes to delay line 63 and input $I_0$ of multiplexer 64. Delay line 63 is a tapped delay line circuit having 9 delay taps "a" through "i" providing an incremental delay from the input port to the output tap. Resistor 69 sets the impedance at the output taps. The delay from input path 51b to output tap "a" is 10 ns in this embodiment. Each tap increases the amount of delay over the preceding delay tap by 10 ns, so that the maximum delay at tap "i" is 90 ns. For no added delay path 51a can bypass delay line circuit 63 altogether. To select a particular tap on delay line 63 or to bypass it, multiplexers 64 and 65 are used. These two digital multiplexers respond to the BCD input select signals at inputs $S_0$-$S_2$ (the fourth bit acts as a device enable control) to select one of the inputs $I_0$ through $I_9$ which correspond to bypass line 51a and to output taps "a" through "i". The Z outputs of multiplexer 64 and 65 are AND'ed together by AND gate 66 and outputted on path 61. Inverter 6B insures that mux 65 and mux 64 are not both on at the same times.

In some cases the use of a delay line to vary the pulse width of the main pulse out, may be undesirable for some very practical reasons. Most delay line circuits have a deleterious effect upon the rise times of a pulse signal. A soft corner on the leading edge of the end pulse on path 61 can cause flip-flop 70 to toggle at a slightly different times depending upon the toggle threshold voltage of flip-flop 70.

Figure 4:
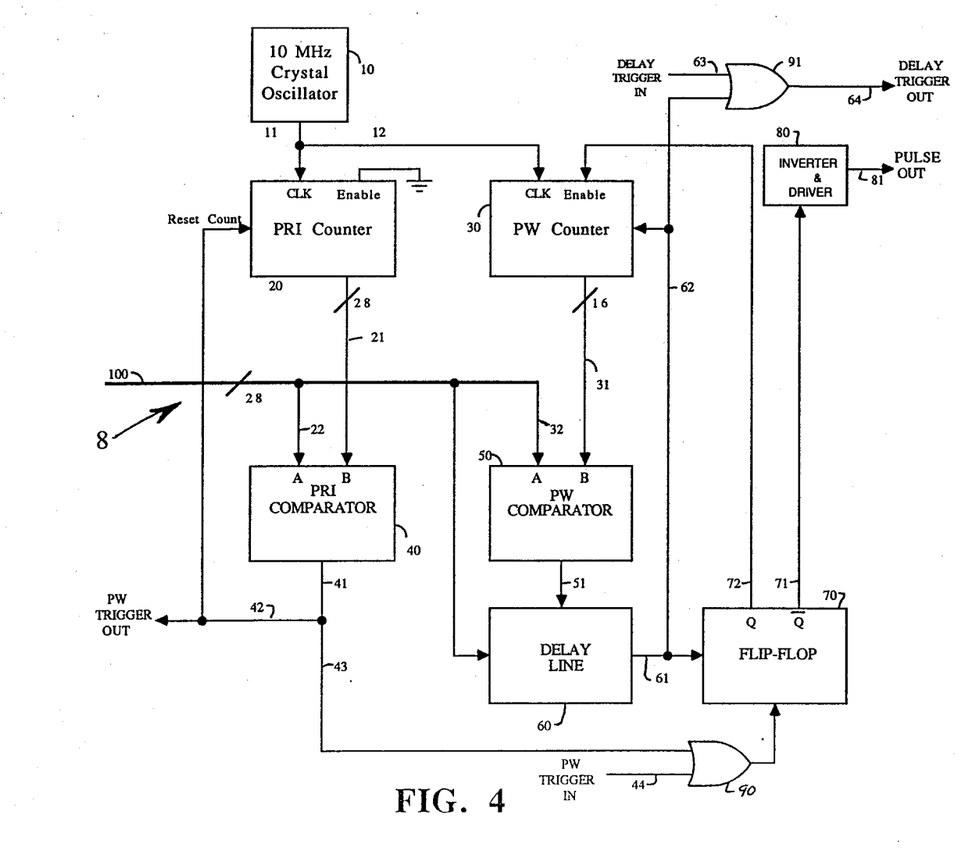
FIG. 4 is a schematic block diagram of the pulse generator shown in FIG. 1 with added gates to operate in a cascaded mode.

Another feature of this invention is the relative ease with which the basic pulse generator of FIG. 1 can be cascaded into a more complex architecture, somewhat similar to "bit slice" microprocessors, to produce more than a single repetitive pulse waveform. For example different pulse groupings can be generated by using additional pulse generators as delays to trigger the output toggle circuit flip-flop 70 of the first pulse generator. In addition to being a more complex waveform, the pulse groups are precisely regulated in time by the reference clock generator which in the preferred embodiment is crystal controlled. FIG. 4 illustrates in block diagram form a pulse generator 8 which can be cascaded in the manner shown in FIG. 5. As is evident from the drawings, pulse generator 8 consists of the basic generator circuit 7 with AND gates (90 and 91) added for inter-stage control and a means for disabling the PRI counter 20. This circuit can generate a three-pulse group PRI if connected with two other pulse generator sections in the manner shown in FIG. 5. It is easiest to understand the functional operation of the three-pulse group PRI generator by referring to the timing diagram shown in FIG. 6.

Figure 5:
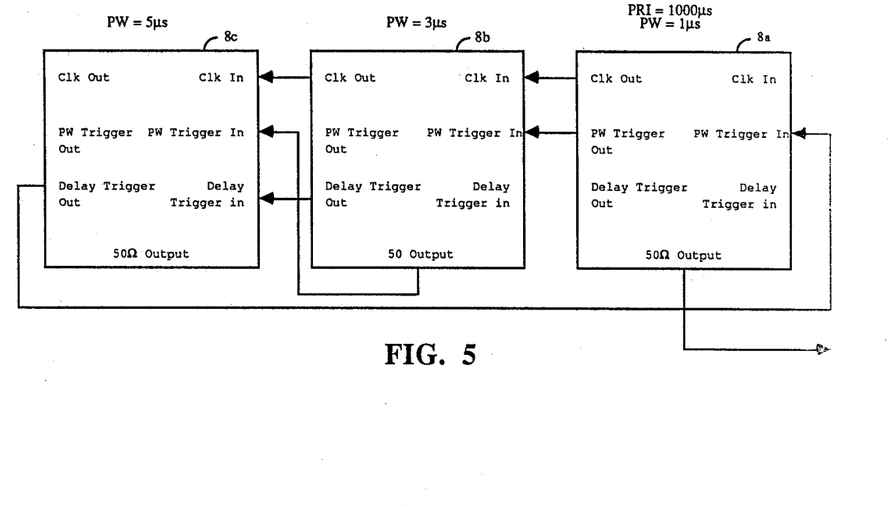
FIG. 5 is a schematic block diagram of cascaded pulse generators of the type shown in FIG. 4; and, FIG. 6 is a timing diagram illustrating the operation of the pulse generator depicted in FIG. 5.
Figure 6:
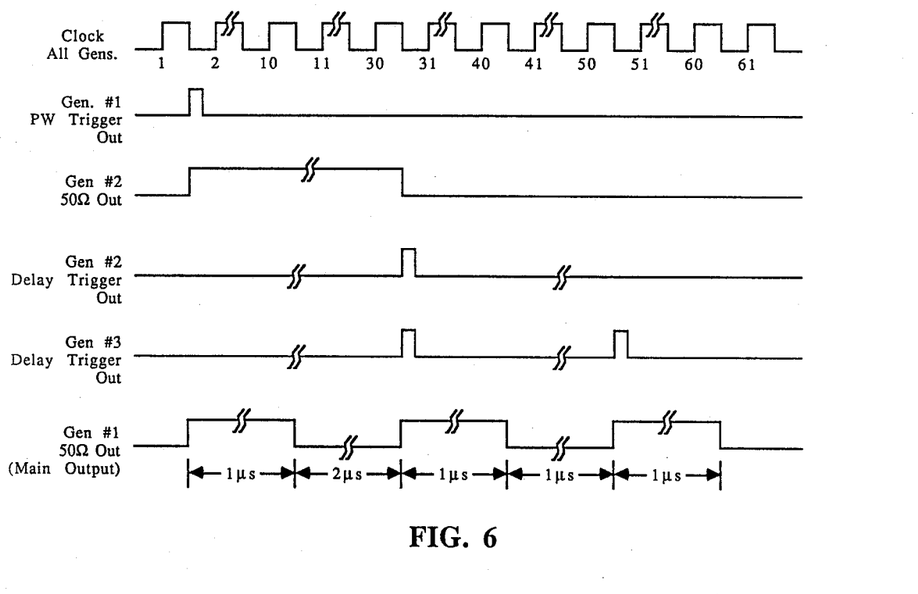

In FIG. 5, the two generators 8b and 8c set for delay have their PRI counters (20) disabled by grounding the enable input 19 in FIG. 4. The start pulse on path 42 from the first generator 8a triggers the PW counters in 8b and 8c. As each of these PW's finish, their compare pulse on path 61 is sent back to the first generator to retrigger its PW counter 30 to generate additional pulses delayed by the settings of these generators. Certainly other pulse groupings are possible by cascading various stages of the pulse generator 8.

Thus it can be seen that the pulse generator shown in FIG. 1 is capable of producing a pulse waveform having an adjustable PRI and pulse width both locked to a ultra stable clock signal. In a specific embodiment, the delay line 60 device was fabricated with the following commercially available components.

Delay Line 63: P/N 2214-200A made by Data Delay Devices Inc. of Clifton, N.J.,

Multiplexers 64 and 65: P/N 74F151A made by Texas Instruments (TI) of Dallas, Tex.;

While the invention has been shown and described with reference to its preferred embodiments, it will be understood by those skilled in the art that various changes may be made and equivalents may be substituted for elements thereof without departing from the true spirit and scope of the invention. In addition, many modifications may be made to adapt a particular situation to the teaching of the invention without departing from its essential teachings.

What is claimed is:

1. A pulse generator for producing a pulsed output signal having a pulse width (PW) and pulse repetition interval (PRI) which are accurately and independently controllable, said generator comprising:

a reference clock signal generator means for generating a first digital signal, $f_1(t)$, said signal having a very stable repetition rate equal to $f_c$;

first counter means for counting the number of pulses in said $f_1(t)$ and for generating a second digital signal, $f_2(t)$, directly related to the number of counted pulses, said counter means including first resetting means for resetting said first counter means to a zero count, second counter means for counting the number of pulses in said $f_1(t)$ and for generating a third digital signal, $f_3(t)$, directly related to the number of counted pulses, said second counter means including second resetting means for resetting said second counter means to a zero count and means for enabling and disabling said second counter means;

first comparator means for producing a start pulse signal when the number of pulses represented by said $f_2(t)$ equals a first predetermined number, $N_1$, where $N_1 = (PRI)(f_c)$, said start pulse causing said first counter means to reset;

second comparator means for producing an end pulse signal when the number of pulses represented by said $f_3(t)$ equals a second predetermined number, $N_2$, where $N_2 = (PW)(f_c)$, said end pulse signal causing said second counter means to reset, and, bistable circuit means capable of being toggled by said start pulse signal and by said end pulse signal, said bistable circuit means generating a repetitive output pulse signal, each output pulse having a pulse width controlled by the time difference between said start and said end pulse signals, said output pulse enabling said second counter means upon receiving a start pulse signal and disabling said second counter means upon receiving of an end pulse signal.

2. The pulse generator according to claim 1 in which said reference clock signal generator means comprises a crystal controlled oscillator.

3. The pulse generator according to claim 2 in which said bistable circuit means comprises a J-K flip-flop.

4. The pulse generator according to claim 1 further comprising:

delay means for receiving said end pulse signal from said second comparator means and for delaying the transmission of said end pulse signal to said bistable circuit means by a finite time period less than the time interval between said end pulse and said start pulse signals.

5. The pulse generator according to claim 4 in which said finite time period is less than 90 ns.

6. The pulse generator according to claim 4 wherein said finite time period of said delay means is varied in response to an external control signal.

7. The pulse generator according to claim 4 further comprising amplifier means for receiving and amplifying said repetitive output pulse signal.

8. The pulse generator according to claim 7 in which said second digital signal comprises a binary coded decimal signal for representing said number of counted pulses.

9. The pulse generator according to claim 8 in which said clock rep rate is 10 Mb/s.

10. A pulse generator for producing a pulsed output signal having a pulse width (PW) and pulse repetition interval (PRI) which are independently controllable and referenced to an external clock signal having a pulse rep rate of $f_c$, said generator comprising:

first counter means for counting the number of pulses in said external clock signal and for generating a first digital signal directly related to the number of counted pulses, said counter means including first resetting means for resetting said first counter means to a zero count;

second counter means for counting the number of pulses in said external clock signal and for generating a second digital signal directly related to the number of counted pulses, said counter means including second resetting means for resetting said second counter means to a zero count and means for disabling said second counter means;

first comparator means for producing a start pulse signal when the count represented by said first digital signal equals a first predetermined number, $N_1$, where $N_1 = (PRI)(f_c)$, said start pulse triggering said first resetting means to reset said first counter means;

second comparator means for producing an end pulse signal when the count represented by said second counter means equals a second predetermined number, $N_2$, where $N_2 = (PW)(f_c)$, said end pulse triggering said second resetting means to reset said second counter means to reset; and, bistable circuit means connected to said first and second comparator means and capable of being toggled by said start pulse signal and by said end pulse signal, said bistable circuit means generating a single pulse signal for the time interval between said start and said end pulse signals, and said bistable circuit means disabling said second counter means for the time interval between every end and start pulse signals.

11. The pulse generator according to claim 10 in which said bistable circuit means comprises a J-K flip-flop.

12. The pulse generator according to claim 11 further comprising:

delay means for receiving said end pulse signal from said second comparator means and for delaying the transmission of said end pulse signal to said bistable circuit means by a finite time period less than the time interval between said end pulse and said start pulse signals.

13. The pulse generator according to claim 12 wherein said finite time period of said delay means is varied in response to an external control signal.

14. The pulse generator according to claim 13 in which said second digital signal comprises a binary coded decimal signal for representing said number of counted pulses.

15. A pulse generator for producing a periodic pulse output signal $f_4(t)$ having a pulse width (PW) and pulse repetition interval (PRI) which are accurately and independently controllable through first and second external control signals, and having a time base accuracy referenced to an external digital clock signal, $f_1(t)$, having a very stable pulse repetition rate $f_c$, said generator comprising:

first counter means receiving said clock signal and counting the pulses therein, said first counter means generating a second digital signal, $f_2(t)$, directly related to the number of counted pulses in said $f_1(t)$, said counter means including first resetting means for resetting said first counter means to a zero count;

second counter means receiving said clock signal and counting the pulses therein, second counter means generating a third digital signal, $f_3(t)$, directly related to the number of counted pulses in said $f_1(t)$, said second counter means including second resetting means for resetting said second counter means to a zero count and enabling means for enabling said second counter means;

first comparator means receiving said second digital signal and first external control signal, said comparator means comparing the number of pulses represented by said $f_2(t)$ with the number represented by $N_1$, where $N_1$ is determined by said first external control signal, and producing a start pulse signal when the number represented by $f_2(t)$ and $N_1$ are equal, said start pulse signal coupled to said first resetting means for triggering the reset;

second comparator means receiving said third digital signal and second external control signal, said comparator means comparing the number of pulses represented by said $f_3(t)$ with the number represented by $N_2$, where $N_2$ is determined by said second external control signal, and producing an end pulse signal when the number represented by $f_3(t)$ and $N_2$ are equal, said end pulse signal coupled to said second resetting means for triggering the reset; and, bistable circuit means capable of being toggled by said start pulse signal and by said end pulse signal, said bistable circuit means generating said periodic output pulse signal $f_4(t)$, each output pulse of $f_4(t)$ having a pulse width controlled by the time difference between said start and said end pulse signals, said output pulse being coupled to said enabling means for periodically enabling said second counter means during the time interval of each of sad output pulses.

16. The pulse generator according to claim 15 further comprising:

delay means for receiving said end pulse signal from said second comparator means and for delaying the transmission of said end pulse signal to said bistable circuit means by a finite time period less than the time interval between said end pulse and said start pulse signals.

17. The pulse generator according to claim 16 wherein $f_2(t)$, $f_3(t)$, $N_1$, and $N_2$ are in binary-coded-decimal format.

18. A pulse generator for producing a periodic pulse output signal, each pulse of which has a pulse width (PW) and a pulse repetition interval (PRI) which are independently controllable and referenced to an external clock signal having a pulse rep rate of $f_c$, said generator comprising:

a first digital counter having a first CLK input receiving said external clock signal, said first digital counter generating a first BCD output signal corresponding to the number of counted clock pulses, said digital counter including a first reset input for resetting said first counter to a zero count;

a second digital counter having a second CLK input receiving said external clock signal, said second digital counter generating a second BCD output signal corresponding to the number of counted clock pulses, said second digital counter including a second reset input for resetting said second counter to a zero count and an enable input for enabling said second counte;, a first digital comparator receiving said first BCD output signal and generating a start pulse signal whenever the count represented by said first BCD signal equals a predetermined count $N_1$, where $N_1=(PRI)(f_c)$, said start pulse signal coupled to said first reset input for resetting said first counter;

a second comparator receiving said second BCD output signal and generating an end pulse signal whenever the count represented by said second counter equals a predetermined count $N_2$, where $N_2=(PW)(f_c)$, said end pulse signal coupled to said second reset input for resetting said second counter; and, a J-K flip-flop having J and K inputs and a Q output, said J and K inputs receiving said start and end pulse signals for toggling said flip-flop, said flip-flop generating at the Q output said desired periodic pulse signal, each pulse of which is determined by the time interval between said start and said end pulses, said Q output coupled to said enable input for enabling said second counter only for the time interval of each pulse of said desired output pulses.

* * * * *